US011327125B2

(12) United States Patent
Shkury et al.

(10) Patent No.: US 11,327,125 B2
(45) Date of Patent: May 10, 2022

(54) GROUND MONITORING TESTER

(71) Applicants: Ezra Shkury, Tirat Carmel (IL); Uri Shkury, Tirat Carmel (IL)

(72) Inventors: Ezra Shkury, Tirat Carmel (IL); Uri Shkury, Tirat Carmel (IL)

(*) Notice: Subject to any disclaimer, the term of this patent is extended or adjusted under 35 U.S.C. 154(b) by 0 days.

(21) Appl. No.: 17/105,556

(22) Filed: Nov. 26, 2020

(65) Prior Publication Data

US 2021/0080513 A1  Mar. 18, 2021

Related U.S. Application Data

(63) Continuation-in-part of application No. PCT/IL2019/050599, filed on May 27, 2019.

(60) Provisional application No. 62/677,084, filed on May 28, 2018.

(51) Int. Cl.
*G01R 31/52* (2020.01)
*H02H 3/04* (2006.01)
*G01R 31/08* (2020.01)
*H02H 1/00* (2006.01)
*H02H 3/16* (2006.01)
*H02H 7/04* (2006.01)

(52) U.S. Cl.
CPC ........... *G01R 31/52* (2020.01); *G01R 31/086* (2013.01); *H02H 1/0007* (2013.01); *H02H 3/04* (2013.01); *H02H 3/162* (2013.01); *H02H 7/04* (2013.01)

(58) Field of Classification Search
CPC .... G01R 31/52; G01R 31/086; H02H 1/0007; H02H 3/04
See application file for complete search history.

(56) References Cited

U.S. PATENT DOCUMENTS

| 10,768,243 | B2* | 9/2020 | Englert | G01R 31/52 |
| 2002/0024342 | A1* | 2/2002 | Bussinger | G01R 31/083 324/541 |
| 2008/0000787 | A1 | 1/2008 | Cress | |
| 2010/0145542 | A1 | 6/2010 | Chapel et al. | |
| 2010/0301872 | A1 | 12/2010 | Kereit | |
| 2012/0319660 | A1 | 12/2012 | Hagenmaier, Jr. | |

(Continued)

FOREIGN PATENT DOCUMENTS

| ES | 2464097 T3 | 5/2014 |
| WO | 2017180525 A1 | 10/2017 |

*Primary Examiner* — Scott Bauer
(74) *Attorney, Agent, or Firm* — Mark M. Friedman

(57) ABSTRACT

A ground monitoring tester for an AC power network, the tester comprising: a processor configured to repeatedly conduct impedance measurements of the ground of said AC power network at a point between a neutral reference point and the ground, wherein the processor is configured to conduct the impedance measurements repeatedly at intervals such as between 2 milliseconds and 2 minutes, indefinitely (i.e. without a time limit ending the measurements), whether or not the appliance or system is operational and whether or not there is an indication of a problem in the ground of said AC power network, wherein each of the impedance measurements is based on a voltage differential between a sequence of voltages including a first voltage without an internally generated reference current and a second voltage with an internally generated reference current, and at least one indication output based on the impedance measurements of the ground.

17 Claims, 3 Drawing Sheets

(56) References Cited

U.S. PATENT DOCUMENTS

| | | | |
|---|---|---|---|
| 2013/0030742 A1* | 1/2013 | Banerjee | G01R 31/343 702/76 |
| 2013/0308229 A1* | 11/2013 | Faxvog | H02H 3/338 361/35 |
| 2014/0177117 A1* | 6/2014 | Curtis | H02H 3/162 361/93.1 |
| 2015/0253371 A1* | 9/2015 | Cohen Gadol | G01R 31/001 324/654 |
| 2015/0311697 A1* | 10/2015 | Faxvog | H02H 9/08 361/35 |
| 2016/0315461 A1* | 10/2016 | Pieler | H02H 3/20 |
| 2017/0110869 A1 | 4/2017 | Bargues | |
| 2017/0138991 A1* | 5/2017 | Curtis | H01H 47/00 |
| 2019/0288499 A1* | 9/2019 | Jensen | H02H 9/08 |
| 2019/0288502 A1* | 9/2019 | Jensen | H02H 1/003 |

\* cited by examiner

GROUND MONITORING TESTER

TECHNICAL FIELD

The present disclosed subject matter relates to electrical earth (ground) connection. More particularly, the present disclosed subject matter relates to continuous monitoring of protective earth (PE).

BACKGROUND

An earth ground connection of exposed conductive parts of electrical equipment helps protect from electric shock by keeping the exposed conductive surface of connected devices close to earth potential. When a fault occurs, current may flow from the power-lines to earth through the protective earth circuitry. In some cases the current may be high enough to trip an over current protection fuse or circuit breaker, which will then interrupt the power line. To ensure that voltage applied in case of a fault on exposed, conductive, surfaces is not too high, impedance (resistance) of the connection to earth must be kept low, less than 5 ohms, relative to equivalent human resistance.

In power-lines of one phase or more that distribute electric power to residential and commercial consumers, the main concern for design of earthing systems is safety of consumers who use the electric appliances and their protection against electric shocks. The earthing system, in combination with protective devices such as fuses/circuit breaker (CB) and a ground fault interrupter (GFI), also known as residual-current device (RCD); residual-current circuit breaker (RCCB); ground fault circuit interrupter (GFCI); and appliance leakage current interrupter (ALCI). The GFI device breaks the power line, to prevent electric shock, if a return current is not equal to a drawn current of the power line circuit. Such inequality between the two implies that some of the current flowed to the ground through unwanted load. Therefore, GFI devices ultimately protect humans that came in touch with a conductive object of an electrical device operated by 50 volts or higher.

SUMMARY OF THE EMBODIMENTS

According to a first aspect of the present disclosed subject matter, a ground monitoring tester for an AC power network that powers an appliance or system, the tester comprising a processor configured to repeatedly conduct impedance measurements of the ground of said AC power network at a point between a neutral reference point and the ground, wherein the processor is configured to conduct the impedance measurements repeatedly and indefinitely at intervals of between 2 milliseconds and 2 minutes, whether or not the appliance or system is operational and whether or not there is an indication of a problem in the ground of said AC power network, wherein each of the impedance measurements is based on a voltage differential between a sequence of voltages including a first voltage and a second voltage such that one of the voltages is without an internally generated reference current and another of the voltages is with an internally generated reference current; and an input/output (I/O) module for providing at least one indication output reporting a ground status of the ground based on said impedance measurements of the ground, wherein the ground monitoring tester is permanently connected in said AC power network of said appliance or system.

In some embodiments, the point is connected at an electrical supplier transformer.

In some embodiments, wherein the processor is configured to conduct the repeated impedance measurements at intervals of between 1 second and 5 seconds.

In some embodiments, the at least one indication continuously reporting a status of the ground status based on said impedance measurements. In some embodiments, the at least one indication is at least one indicator selected from a group consisting of: at least one LED; at least one buzzer; at least one power interrupt signal; at least one communication port; and any combination thereof.

In some embodiments, the indication interrupts an AC power-line that feed said power-line network. In some embodiments, the indication interrupts an AC power-line that feed a power-line circuit. In some embodiments, the indication interrupts an AC power-line that feed a power-line socket. In some embodiments, the indication interrupts an AC power-line that feed an appliance.

In some embodiments, the tester is incorporated with devices selected from a group consisting of: sockets; adapters; appliances main distribution panel; and any combination thereof.

In some embodiments, the at least one indication output is configured to interrupt power in response to a ground status associated with a first threshold for impedance and to provide a warning in response to a ground status associated with a range or a second threshold for impedance.

According to a further aspect of the present disclosed subject matter, a ground monitoring system integrated in an AC power network, the system comprising: a plurality of ground monitoring testers wherein the plurality of testers is configured to communicate with one another by utilizing their at least one communication port, each ground monitoring tester of the plurality comprising:

a processor configured to repeatedly conduct impedance measurements of the ground of said AC power network at a point between a neutral reference point and the ground, wherein the processor is configured to conduct the impedance measurements repeatedly and indefinitely at intervals of between 2 milliseconds and 2 minutes, whether or not the appliance or system is operational and whether or not there is an indication of a problem in the ground of said AC power network, wherein each of the impedance measurements is based on a voltage differential between a sequence of voltages including a first voltage and a second voltage such that one of the voltages is without an internally generated reference current and another of the voltages is with an internally generated reference current; and an input/output (I/O) module for providing at least one indication output reporting a ground status of the ground based on said impedance measurements of the ground, wherein the ground monitoring tester is permanently connected in said AC power network.

In some embodiments, each tester communicates information that comprises its ground status.

In some embodiments, each tester can interrupt an AC power-line it is associated with based on the information.

According to a further aspect of the present disclosed subject matter, a ground monitoring system integrated in an AC power network, the system comprising: a plurality of ground monitoring testers, wherein the plurality of testers is configured to communicate with one another by utilizing their at least one communication port, each ground monitoring tester of the plurality comprising:

a processor configured to repeatedly conduct impedance measurements of the ground of said AC power network at a point between a neutral reference point and the ground, wherein the processor is configured to conduct the impedance measurements repeatedly at intervals of between 2 milliseconds and 2 minutes, without a time limit ending the measurements, whether or not the appliance or system is operational and whether or not there is an indication of a problem in the ground of said AC power network, wherein each of the impedance measurements is based on a voltage differential between a sequence of voltages including a first voltage and a second voltage such that one of the voltages is without an internally generated reference current and another of the voltages is with an internally generated reference current; and an input/output (I/O) module for providing at least one indication output reporting a ground status of the ground based on said impedance measurements of the ground, wherein the ground monitoring tester is permanently connected in said AC power network.

In some embodiments, each tester communicates information that comprises its ground status.

In some embodiments, each tester can interrupt an AC power-line it is associated with based on the information.

Unless otherwise defined, all technical and scientific terms used herein have the same meaning as commonly understood by one of ordinary skill in the art to which this disclosed subject matter belongs. Although methods and materials similar or equivalent to those described herein can be used in the practice or testing of the present disclosed subject matter, suitable methods and materials are described below. In case of conflict, the specification, including definitions, will control. In addition, the materials, methods, and examples are illustrative only and not intended to be limiting.

BRIEF DESCRIPTION OF THE DRAWINGS

Some embodiments of the disclosed subject matter described, by way of example only, with reference to the accompanying drawings. With specific reference now to the drawings in detail, it is stressed that the particulars shown are by way of example and for purposes of illustrative discussion of the preferred embodiments of the present disclosed subject matter only, and are presented in the cause of providing what is believed to be the most useful and readily understood description of the principles and conceptual aspects of the disclosed subject matter. In this regard, no attempt is made to show structural details of the disclosed subject matter in more detail than is necessary for a fundamental understanding of the disclosed subject matter, the description taken with the drawings making apparent to those skilled in the art how the several forms of the disclosed subject matter may be embodied in practice.

In the drawings.

DETAILED DESCRIPTION

Figure 1:
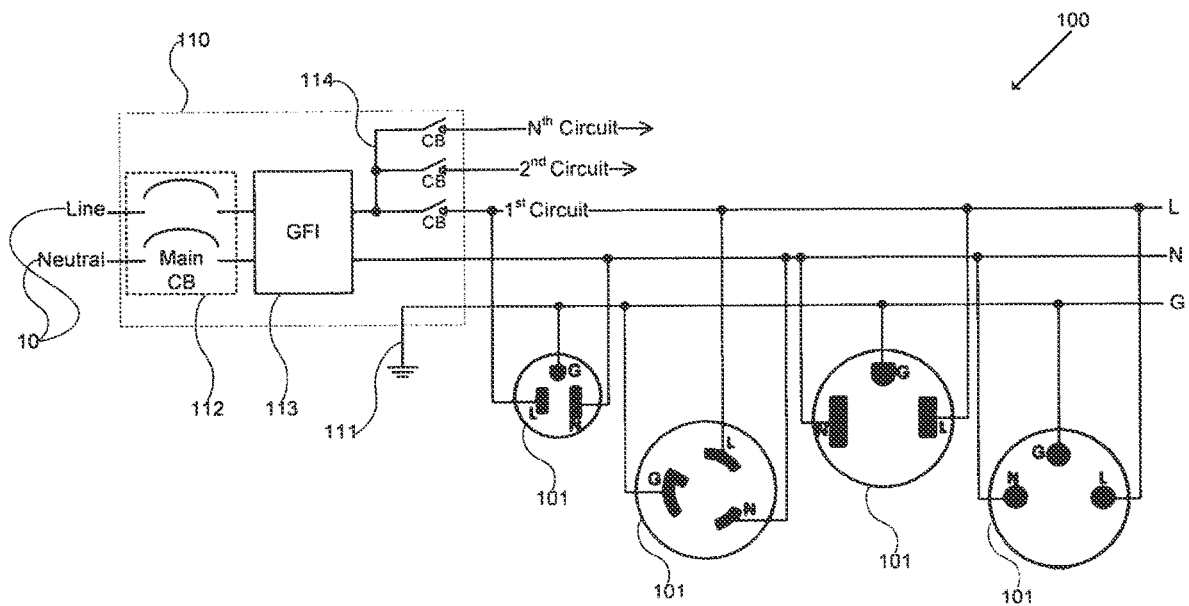
FIG. 1 schematically illustrates a typical residential/commercial power-line network, in accordance with some exemplary embodiments of the disclosed subject matter.

Before explaining at least one embodiment of the disclosed subject matter in detail, it is to be understood that the disclosed subject matter is not limited in its application to the details of construction and the arrangement of the components set forth in the following description or illustrated in the drawings. The disclosed subject matter is capable of other embodiments or of being practiced or carried out in various ways. Also, it is to be understood that the phraseology and terminology employed herein is for the purpose of description and should not be regarded as limiting. The drawings are generally not to scale. For clarity, non-essential elements were omitted from some of the drawings.

The terms "comprises", "comprising", "includes", "including", and "having" together with their conjugates mean "including but not limited to". The term "consisting of" has the same meaning as "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this disclosed subject matter may be presented in a range format. It should be understood that the description in range format is merely for convenience and brevity and should not be construed as an inflexible limitation on the scope of the disclosed subject matter. Accordingly, the description of a range should be considered to have specifically disclosed all the possible sub-ranges as well as individual numerical values within that range.

It is appreciated that certain features of the disclosed subject matter, which are, for clarity, described in the context of separate embodiments, may also be provided in combination in a single embodiment. Conversely, various features of the disclosed subject matter, which are, for brevity, described in the context of a single embodiment, may also be provided separately or in any suitable sub-combination or as suitable in any other described embodiment of the disclosed subject matter. Certain features described in the context of various embodiments are not to be considered essential features of those embodiments, unless the embodiment is inoperative without those elements.

One technical problem dealt with by the present discloser are that all, known in the art, protection devices, such as circuit breaker (CB), GFI, a combination thereof, or the like are ultimately depending on properly connected ground (earth). Thus, an effective earth continuity is mandatory in cases, such as fault electrical path that accidentally energizes objects, e.g. appliance chassis or conductive surface that human may come in touch with. When the protective earth (PE) is properly connected a fault electrical path to the PE shall have low impedance, which will result in current surge that interrupts the power by any of the known in the art protection devices. However, if the PE connection is damaged or doesn't yield low impedance to the ground, none of the protection devices will be activated in order to trip the power line. Therefore, the equipment/appliance enclosure may be energized by more than 50V, which can cause electrocution to humans touching the appliance.

Ground connections between, a plurality of power outlets and main distribution panel (MDP) and between a facility ground may be disconnected over time due to construction, maintenance, poor connection, corrosion, physical deterioration, and any combination thereof, or the like. Additionally, ground connections between an equipment/appliance enclosure/chassis and a ground prong of a power plug of the equipment may also be disconnected or poor, in terms of impedance.

Ground/earth quality testers, such as Megger are known in the art; however, they are used only by licensed electricians while debugging a problem or certifying electrical systems in new facility. Therefore, residential or commercial users/customers may not be aware of improper protective earth until it is too late.

Another technical problem dealt with by the disclosed subject matter is that validation of the ground system impedance may be tested occasionally and not monitored in periodically, thus, a faulty ground that can occur over time, may lead to fatal injury.

One technical solution provided by the present disclosure is a ground monitoring tester adapted to be permanently installed in a, residential/commercial, AC power network and configured to continuously test the ground quality.

It should be noted that, ground quality, i.e. safety criteria, is measured in ohms, particularly the resistance between any phase of the network to the ground (resistance) should not exceed 5 ohms, and in some countries 3 ohms.

In some exemplary embodiments, the ground monitoring tester is configured to measure resistance sequentially, wherein the sequence can vary from a few (two or three) milliseconds to one to five seconds to a few (two or three) minutes or more. Thus, it will be noted that, the measurements of the resistance can be done continuously.

Another technical solution provided by the present disclosure is providing the user, of the ground monitoring tester, with at least one of the following indications upon determining a faulty ground, i.e. resistance that exceeds 3 or 5 ohms. In some exemplary embodiments, the indications can comprise: turning on an alarm LED, activating a buzzer, disconnecting the power-line, communicating an alarm indication to a computerized device, and any combination thereof, or the like.

Another technical solution provided by the present disclosure is distinguishing between a complete break of the ground connection and a poor impedance/resistance (R). For example, $5\Omega<R<15\Omega$ may be defined as poor impedance, whereas $R>15\Omega$ may be defined as disconnected ground wiring. In such exemplary embodiments, the indications may be different according to the measured resistance, for example above $15\Omega$ all indications may be activated (including power line disconnect) and for bellow $15\Omega$ indications excluding power line disconnect may be activated.

Referring now to FIG. 1 schematically illustrating a typical residential/commercial power-line network 100, in accordance with some exemplary embodiments of the disclosed subject matter. The power-line network (network) 100 can be comprised of at least one circuit ($1^{st}$ to $n^{th}$ circuits), each having at least one receptacle (socket) 101, wherein each circuit may be protected by a dedicated CB 114. Additionally, the network may have at least one main distribution panel (MDP) 110 that can comprise: a power line feed 10 from the power utility provider, a main CB 112 and a GFI 113. In some networks the MDP 110 may also accommodate the circuits breakers (CB)s 114.

For the sake of simplifying the description, FIG. 1 depicts a typical residential network of a single phase, however it is noted that the solution provided by the present disclosure is engineered for residential and commercial AC voltages of single and multi-phase networks that are commonly used in the world. Moreover, the present disclosure is universally designed to accommodate any type of power grid known in the art, regardless of the type of socks, circuit breakers, MDPs, wiring, fuses, enclosures and any combination thereof, or the like. It should be noted that none of the components depicted in network 100 of FIG. 1 are essential for installing and utilizing the ground monitoring tester since FIG. 1 is only one example of an environment that the present disclosure can be deployed in. Moreover, the measurement of the resistance as disclosed below is effectively also the measurement of the impedance since the difference is insignificant for the purposes of a tester that determines whether the ground is in proper condition to prevent electrocution, especially for residential networks where the frequency is low (for example 50 Hertz) and based on the size of the cables.

Typical commercial/residential power line networks may be equipped with a circuit breakers, such as CB 112, and or ground fault interrupters, such as GFI 113. The circuit breakers are typically designed to interrupt the power line in an event of over-current (short-circuit) and the ground fault interrupters is also designed to interrupt the power in case of current leakage to the ground.

Figure 2:
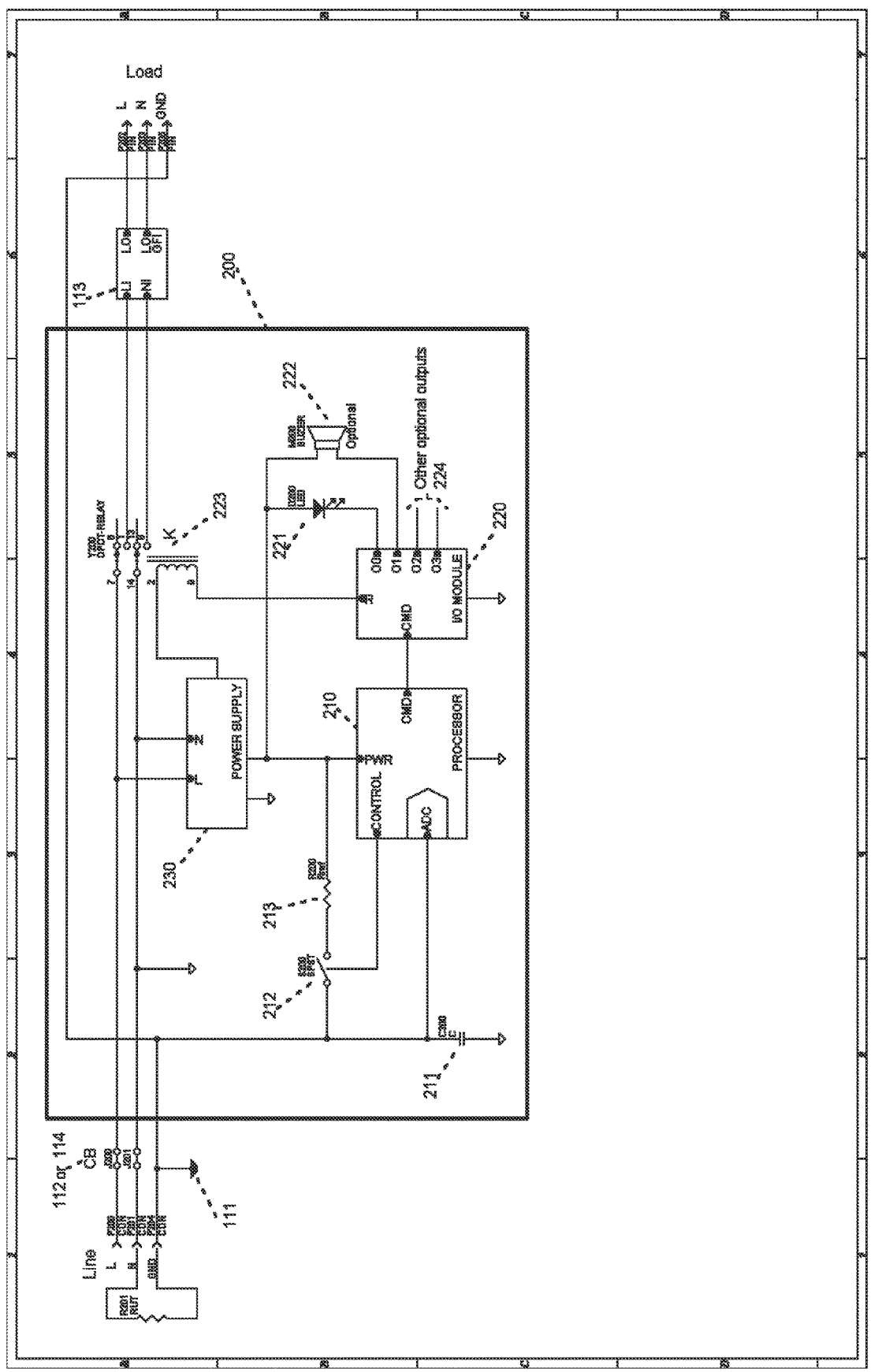
FIG. 2 shows a block diagram of a ground monitoring tester, in accordance with some exemplary embodiments of the disclosed subject matter.

Referring now to FIG. 2 showing a block diagram of a ground monitoring tester 200, in accordance with some exemplary embodiments of the disclosed subject matter. The ground monitoring tester 200 can be a computerized device adapted to perform operations involving measurements of resistance R and providing indications concerning the ground quality.

In some exemplary embodiments, ground monitoring tester 200 may comprise a processor 210. Processor 210 may be a central processing unit (CPU), a microprocessor, an electronic circuit, an integrated circuit (IC) or the like. Additionally, or alternatively, the ground monitoring tester 200 can be implemented as firmware written for or ported to a specific processor such as digital signal processor (DSP) or microcontrollers, or can be implemented as hardware or configurable hardware such as field programmable gate array (FPGA) or application specific integrated circuit (ASIC). Processor 210 may be utilized to perform computations required by ground monitoring tester 200 or any of its subcomponents.

In some exemplary embodiments, the ground monitoring tester 200 may comprise a power-supply 230, fed by the AC power of the network. The power-supply 230 is designed to provide DC voltage necessary for the operation of the ground monitoring tester 200 components.

In some exemplary embodiments of the disclosed subject matter, the ground monitoring tester 200 may comprise an input/output (I/O) module 220. Ground monitoring tester 200 may utilize the I/O module 220 as an interface to transmit and/or receive information, indications and instructions between the ground monitoring tester 200 and external I/O devices, such as at least one ground fault LED indicator 221, at least one ground fault buzzer 222, at least one power interrupt signal, at least one communication port, and any combination thereof, or the like.

Following a ground fault determination, by the processor 210, the I/O 220 may activate LED 221 and/or Buzzer 222 to indicate a ground fault condition. Additionally, or alternatively, upon the processor instruction, the I/O 220 may be configured to initiate power interrupt signal for activating contactor (K) 223, which may be wired to trip the power. It should be noted that, that K223 can be either provided as an integral part of tester 200 or as an accessory that will be allocated as per the installation requirements. Regardless of the application of choice, i.e. inside or outside the tester, the power interrupt signal shall be provided as an auxiliary port of the tester. In some exemplary embodiments, the initiation of the power interrupt signal is a manifestation of a critical ground failure that requires power line interruption.

In some exemplary embodiments, the criteria for distinguishing between a complete break of the ground wiring and a poor impedance (R) may be based on the resistance measurement. The following table is an example that represents possible statuses and indications of the tester based on the impedance measurements by processor 210.

| Impedance | LED | Buzzer | Power interrupt signal |
|---|---|---|---|
| 5Ω > R | Green/off | Off | Off |
| 5Ω < R < 10Ω | Red | Off | Off |
| 10Ω < R < 15Ω | Red | On | Off |
| 15Ω < R | Red | Don't care | Active |

In some exemplary embodiments, I/O Module 220 may be used for interfacing with a computerized device of a user (not shown) by communication ports 224, in order to provide the user with information and the capability to configure the tester 200. The information can be selected from a group consisting of indication status, visualized results, impedance measurements report, and any combination thereof, or the like. Additionally, or alternatively, communication (comm.) ports 224 may be used to receive configuration instructions; such as an upper threshold for properly connected ground, e.g. for 3Ω; resistance measurement sequence, or the like.

In some exemplary embodiments, the comm ports 224 implementation, in the present disclosure design, may utilize technologies such Bluetooth, Wi-Fi, Ethernet, any combination thereof, or any radio communication known in the art. Another objective of the communication ports 224 is to alert proper services of a hazard condition of a given power-line network, i.e. broken protection earth connection. In view of the above, it will be appreciated that the ground monitoring tester 200 can operate without human intervention.

In some exemplary embodiments, the ground monitoring tester 200 may comprise a memory (not shown). The memory may be persistent and/or volatile, such as NAND flash, a random-access memory (RAM), a combination thereof, or the like, that can either be embedded within the processor 210 or implemented as independent chip. The memory may retain program code to activate processor 210 to perform acts associated with the impedance measurements, providing indications and communicating with computerized devices as well as other ground monitoring tester 200.

In some exemplary embodiments, processor 210 can be used for measuring the ground impedance R. The measurement sequence may be divided to two cycles. In the first cycle the processor toggles switch (S) 200 "off" to disconnect the internally generated reference current at SPST (S) 200 from the AC power and in the second cycle processor 210 toggles (S) 200 "on" to connect the internally generated reference current at SPST (S) 200 to the AC power. RUT is the physical resistance between Neutral and Ground connected at the electrical supplier transformer. RUT, the ground pin resistance being measured, should satisfy a predefined relationship known to the processor 210 which for some embodiments (for example depending on the country) is R<5Ω and in other embodiments is R<3Ω. The ADC of the processor 210 measures the ground pin resistance twice in a sequence, once with (S)200 open (without an internally generated reference current) and once with (S)200 closed (with an internally generated reference current). The processor 210 is configured to determine the differential voltage between these two voltages and to determine if the differential voltage across RUT satisfies the relationship in which the threshold resistance is predefined for the processor 210, in one non-limiting example R>3Ω*Rref current. If the differential voltage across RUT does exceed the threshold resistance (in the above non-limiting example 3Ω with the given reference current Rref but it could be 5Ω or another threshold number), then the I/O module transmits an instruction for an output such as an LED warning such as LED red, an audio warning such as a buzzer or an instruction cutting off power by sending a power interrupt signal. The determination of which output to send may be pre-set by thresholds of resistance, for example using the non-limiting thresholds provided in the following table.

| Impedance | LED | Buzzer | Power interrupt signal |
|---|---|---|---|
| 5Ω > R | Green/off | Off | Off |
| 5Ω < R < 10Ω | Red | Off | Off |
| 10Ω < R < 15Ω | Red | On | Off |
| 15Ω < R | Red | Don't care | Active |

Another non-limiting example of the thresholds is:

| Impedance | LED | Buzzer | Power interrupt signal |
|---|---|---|---|
| 5Ω > R | Green/off | Off | Off |
| 5Ω < R < 10Ω | Red | Off | Off |
| 10Ω < R | Red | Don't care | Active |

Another non-limiting example of the thresholds is:

| Impedance | LED | Buzzer | Power interrupt signal |
|---|---|---|---|
| 3Ω > R | Green/off | Off | Off |
| 3Ω < R < 15Ω | Red | On | Off |
| 15Ω < R | Red | Don't care | Active |

In some cases, if the impedance is high enough (in one non-limiting example 15Ω<R) the instruct to interrupt goes to an activating contactor 223 to interrupt power. The processor 210 is configured to conduct the impedance measurements repeatedly at intervals of between 2 milliseconds and 2 minutes (such as every quarter second or every half second or every 1-5 seconds or every 10 seconds or every 1 minute or in other versions up to every five minutes or more), for example every second or every two second or every three seconds or four seconds or five seconds, indefinitely (i.e. without a time limit ending the measurements), whether or not the appliance or system is operational and whether or not there is an indication of a problem in the ground of said AC power network.

Another non-limiting example of the thresholds of resistance related to the outputs is binary, for example:

| Impedance | LED | Buzzer | Power interrupt signal |
|---|---|---|---|
| 5Ω > R | Green/off | Off | Off |
| 5Ω ≥ R | Red | Optionally On or Off | Active |

Or, for example:

| Impedance | LED | Buzzer | Power interrupt signal |
|---|---|---|---|
| 3Ω > R | Green/off | Off | Off |
| 3Ω ≥ R | Red | Optionally On or Off | Active |

In the first cycle an analog to digital converter (ADC) of processor 210 is configured to measure the voltage without the internally generated reference current and the voltage with the internally generated reference current. In some exemplary embodiments, the processor determines the impedance R (the resistance between the neutral and the ground) based on these two measurements. Upon predetermined number of sequences, the processor determines the ground quality status based on preconfigured impedance threshold (in ohms) that constitutes a properly connected ground. It will be noted that, these sequence of two cycles can be repeated continuously and indefinitely, wherein a duration of the sequence can be configured.

In some exemplary embodiments, the ground monitoring tester 200 can be used in AC power line network that comprise a plurality of phases, e.g. 2, 3 or 6 AC phases. In such embodiments, only one phase out of the plurality of phases is needed for utilizing the ground monitoring tester 200 in order to conduct the protection earth quality testing.

Figure 3:
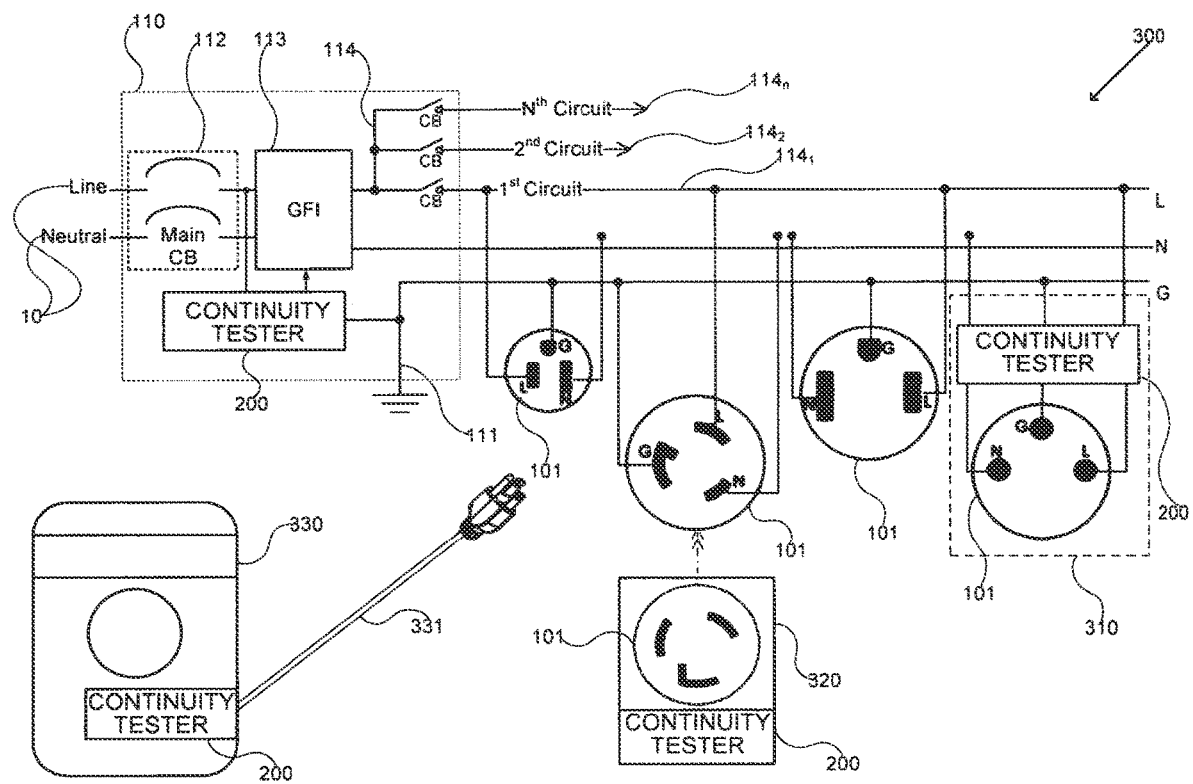
FIG. 3 schematically illustrates integration of continuity testers in residential/commercial power-line network, in accordance with some exemplary embodiments of the disclosed subject matter.

Referring now to FIG. 3 schematically illustrating an integration of ground monitoring testers 200 in residential/commercial power-line network 300, in accordance with some exemplary embodiments of the disclosed subject matter.

It should be noted that, FIG. 3 depict a typical single-phase AC network only for the sake of simplifying the description. However, it will be clear to a person having ordinary skill in the art that the solution provided in this present disclosure can be utilized in an AC network that have a plurality of phases, as previously described. It should also be noted that, any of the sockets 101 depicted in FIG. 3 can be single, dual phase or three phase AC receptacles.

In some exemplary embodiments, any socket 101 of any circuit 114₁ trough 114ₙ can be replaced by monitoring socket (M-socket) 310 that comprise the ground monitoring tester 200. The ground monitoring tester 200 of M-socket 310, may be integrated with socket 101, alternatively, the tester 200 may be situated behind socket 101 and wired to it as per the example provided in FIG. 2. In some exemplary embodiments, the LED 221 can be mounted on a cover of M-socket 310 so it will be visual to the user.

In some exemplary embodiments, the features of the ground monitoring tester 200 depicted in FIG. 2 are applicable to the ground monitoring tester 200 of M-socket 310 with following exceptions:
  a. The circuit breaker is CB 114 of the circuit in which m-socket 310 is connected to.
  b. Instead of the GFI 113, the out poles of K223 are connected to socket 101 of the M-socket 310, so that K223 can trip the power to the electrical appliance/equipment that is plugged to M-socket 310 in case of ground fault.
  c. Additionally, or alternatively, instead of employing K223 for tripping the power, the power interrupt signal of the ground monitoring tester 200 may be routed to a dry-contact (not shown) that can trip CB 114 of the circuit.

In some exemplary embodiments of the disclosed subject matter, a monitoring adapter (adapter) 320 is provided. The adapter 320 can comprise a socket 101, an AC plug (not shown) and a ground monitoring tester 200, all incorporated within one housing. The adapter 320 may be a portable device adapted to be plugged (plug not shown) in any socket 101 of any circuit of a residential or commercial AC network. In some exemplary embodiments, the socket 101 of the adapter 320 is situated opposite to the plug side, so as to allow a user to plug an electrical equipment to the AC power via adapter 320. Thereby, enhancing that a socket of a circuit with the ground monitoring tester of the present disclosure. It will be noted that, the LED 221 is mounted on a cover of adapter 320 so it will be visual to the user.

In some exemplary embodiments, the features of the ground monitoring tester 200 depicted in FIG. 2 are applicable to the ground monitoring tester 200 of adapter 320 with following exceptions:
  a. The circuit breaker is CB 114 of the circuit in which adapter 320 is connected to.
  b. Instead of the GFI 113, the out poles of K223 are connected to socket 101 of the adapter 320, so that K223 can trip the power to the electrical appliance/equipment that is plugged to adapter 320 in case of ground fault.

In some exemplary embodiments of the disclosed subject matter, ground monitoring tester 200 can be provided as an accessory that may be installed in appliance 330 that can be connected to socket 101 by cord 331. Appliance 330 accommodating the ground monitoring tester 200 may be, for example, a washing machine, a dryer, a refrigerator, a computer, a milling machine, a lathe, a drill, a dishwasher, or the like. In such embodiment the ground monitoring tester 200 installed in the appliance 330 is practically testing ground continuity/quality from the appliance 330 via cord 331 through socket 101 all the way to the facility ground of the network.

In some exemplary embodiments, the features of the ground monitoring tester 200 depicted in FIG. 2 are applicable to the ground monitoring tester 200 of appliance 330 with following exceptions:
  a. The circuit breaker is CB 114 of the circuit in which the appliance 330 is connected to. Also, the ground monitoring tester may be powered by cord 331, GFI 113 is not applicable in this embodiment.
  b. The "in" poles of K223 are connected to cord 331 and the "out" poles of K223 are connected to the AC input of appliance 330, so that K223, which is wired in series, can trip the power to appliance 330 in case of ground fault.

In some exemplary embodiments of the disclosed subject matter, the ground monitoring tester 200 can be installed in a main distribution panel (MDP) 110 such as depicted in FIG. 2

In some exemplary embodiments of the disclosed subject matter, ground monitoring tester 200 of M-socket 310, adapter 320, appliance 330 and MDP 110 can communicate with one another via their communication ports 224. A possible scenario of such communication may be, for example: in a condition where more than one M-socket 310 indicate, via communication port 224, a "faulty ground" then the tester 200 of MDP 110 may determine/initiate network shutdown.

One non-limiting embodiment of the disclosed subject matter is a ground monitoring tester for an AC power network that powers an appliance or system, the tester comprising a processor configured to repeatedly conduct impedance measurements of the ground of said AC power network at a point between a neutral reference point and the ground, wherein the processor is configured to conduct the impedance measurements repeatedly and indefinitely, whether or not the appliance or system is operational and whether or not there is an indication of a problem in the ground of said AC power network, wherein each of the impedance measurements is based on a voltage differential between a sequence of voltages including a first voltage and a second voltage such that one of the voltages is without an internally generated reference current and another of the voltages is with an internally generated reference current; and an input/output (I/O) module for providing at least one indication output reporting a ground status of the ground based on said impedance measurements of the ground, wherein the ground monitoring tester is permanently connected in said AC power network of said appliance or system.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A ground monitoring tester for an AC power network that powers an appliance or system, the tester comprising:
    a processor configured to repeatedly conduct impedance measurements of the ground of said AC power network at a point between a neutral reference point and the ground, wherein the processor is configured to conduct the impedance measurements repeatedly and indefinitely at intervals of between 2 milliseconds and 2 minutes, whether or not the appliance or system is operational and whether or not there is an indication of a problem in the ground of said AC power network, wherein each of the impedance measurements is based on a voltage differential between a sequence of voltages including a first voltage and a second voltage such that one of the voltages is without an internally generated reference current and another of the voltages is with an internally generated reference current; and
    an input/output (I/O) module for providing at least one indication output reporting a ground status of the ground based on said impedance measurements of the ground, wherein the ground monitoring tester is permanently connected in said AC power network of said appliance or system.

2. The tester of claim 1, wherein the point is connected at an electrical supplier transformer.

3. The tester of claim 1, wherein the processor is configured to conduct the repeated impedance measurements at intervals of between 1 second and 5 seconds.

4. The tester of claim 1, wherein the at least one indication continuously reporting a status of the ground status based on said impedance measurements.

5. The tester of claim 4, wherein the at least one indication is at least one indicator selected from a group consisting of: at least one LED; at least one buzzer; at least one power interrupt signal; at least one communication port; and any combination thereof.

6. The tester of claim 4, wherein the indication interrupts an AC power-line that feed said power-line network.

7. The tester of claim 4, wherein the indication interrupts an AC power-line that feed a power-line circuit.

8. The tester of claim 4, wherein the indication interrupts an AC power-line that feed a power-line socket.

9. The tester of claim 4, wherein the indication interrupts an AC power-line that feed an appliance.

10. The tester of claim 1, wherein the tester is incorporated with devices selected from a group consisting of: sockets; adapters; appliances main distribution panel; and any combination thereof.

11. The tester of claim 1, wherein the at least one indication output is configured to interrupt power in response to a ground status associated with a first threshold for impedance and to provide a warning in response to a ground status associated with a range or a second threshold for impedance.

12. A ground monitoring system integrated in an AC power network, the system comprising:
    a plurality of ground monitoring testers wherein the plurality of testers is configured to communicate with one another by utilizing their at least one communication port, each ground monitoring tester of the plurality comprising:
        a processor configured to repeatedly conduct impedance measurements of the ground of said AC power network at a point between a neutral reference point and the ground, wherein the processor is configured to conduct the impedance measurements repeatedly and indefinitely at intervals of between 2 milliseconds and 2 minutes, whether or not the appliance or system is operational and whether or not there is an indication of a problem in the ground of said AC power network, wherein each of the impedance measurements is based on a voltage differential between a sequence of voltages including a first voltage and a second voltage such that one of the voltages is without an internally generated reference current and another of the voltages is with an internally generated reference current; and
        an input/output (I/O) module for providing at least one indication output reporting a ground status of the ground based on said impedance measurements of the ground, wherein the ground monitoring tester is permanently connected in said AC power network.

13. The ground monitoring system of claim 12, wherein each tester communicates information that comprises its ground status.

14. The ground monitoring system of claim 13, wherein each tester can interrupt an AC power-line it is associated with based on the information.

15. A ground monitoring system integrated in an AC power network, the system comprising:
    a plurality of ground monitoring testers, wherein the plurality of testers is configured to communicate with one another by utilizing their at least one communication port, each ground monitoring tester of the plurality comprising:
        a processor configured to repeatedly conduct impedance measurements of the ground of said AC power network at a point between a neutral reference point and the ground, wherein the processor is configured to conduct the impedance measurements repeatedly at intervals of between 2 milliseconds and 2 minutes, without a time limit ending the measurements, whether or not the appliance or system is operational and whether or not there is an indication of a problem in the ground of said AC power network, wherein each of the impedance measurements is based on a voltage differential between a sequence of voltages including a first voltage and a second voltage such that one of the voltages is without an internally generated reference current and another of the voltages is with an internally generated reference current; and an input/output (I/O) module for providing at least one indication output reporting a ground status of the ground based on said impedance measurements of the ground, wherein the ground monitoring tester is permanently connected in said AC power network.

16. The ground monitoring system of claim 15, wherein each tester communicates information that comprises its ground status.

17. The ground monitoring system of claim 16, wherein each tester can interrupt an AC power-line it is associated with based on the information.

* * * * *